(12) United States Patent
Zheng et al.

(10) Patent No.: US 7,429,182 B1
(45) Date of Patent: Sep. 30, 2008

(54) SOCKET ASSEMBLY FOR SECURING SOCKET BODY

(75) Inventors: Tieyu Zheng, Chandler, AZ (US); Xiaoqing Ma, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/877,919

(22) Filed: Oct. 24, 2007

(51) Int. Cl.
*H01R 13/44* (2006.01)

(52) U.S. Cl. .................. 439/135; 439/331; 439/940; 439/41

(58) Field of Classification Search .......... 439/135, 439/73, 330, 331, 940, 41, 342
See application file for complete search history.

(56) References Cited

U.S. PATENT DOCUMENTS

| | | | |
|---|---|---|---|
| 6,877,990 B2 * | 4/2005 | Liao et al. .............. | 439/41 |
| 6,905,353 B2 | 6/2005 | Ma et al. | |
| 6,945,798 B2 | 9/2005 | McClellan et al. | |
| 6,971,890 B2 | 12/2005 | Ma | |
| 7,004,768 B2 | 2/2006 | Ma et al. | |
| 7,121,865 B2 | 10/2006 | Bryant | |
| 2004/0053524 A1 | 3/2004 | Trout | |
| 2004/0219808 A1 | 11/2004 | McClellan et al. | |
| 2005/0208813 A1 | 9/2005 | Trout et al. | |

OTHER PUBLICATIONS

Office Action Received for U.S. Appl. No. 11/863,810, mailed Mar. 24, 2008, 8 pgs.
Office Action Received for U.S. Appl. No. 11/863,857, mailed Apr. 1, 2008, 8 pgs.

* cited by examiner

*Primary Examiner*—Javaid Nasri
(74) *Attorney, Agent, or Firm*—Grossman, Tucker, Perreault & Pfleger, PLLC

(57) ABSTRACT

Disclosed is a socket assembly for electrically engaging an IC package with a PCB. The socket assembly includes a socket body, a loading mechanism, and a pick-and-place (PnP) cap. The socket body engages the IC package with the PCB. The loading mechanism includes a loading plate having a central opening and capable of being mounted on the socket body when the loading plate is in a closed position. The PnP cap includes a first plurality of latches configured on a plurality of peripheral edges of the PnP cap and a raised portion configured on an upper surface of the PnP cap. The first plurality of latches engages the PnP cap with the socket body when the PnP cap is in a first position. The second plurality of latches detachably engages the PnP cap with the central opening of the loading plate when the PnP cap is in a second position.

11 Claims, 10 Drawing Sheets

FIG. 2C(iii)

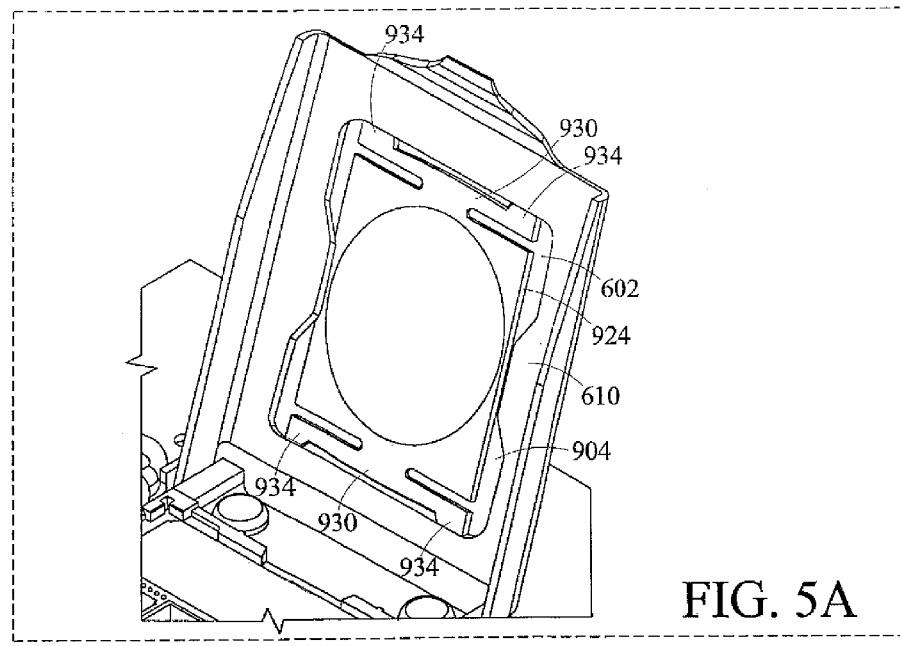
FIG. 5A
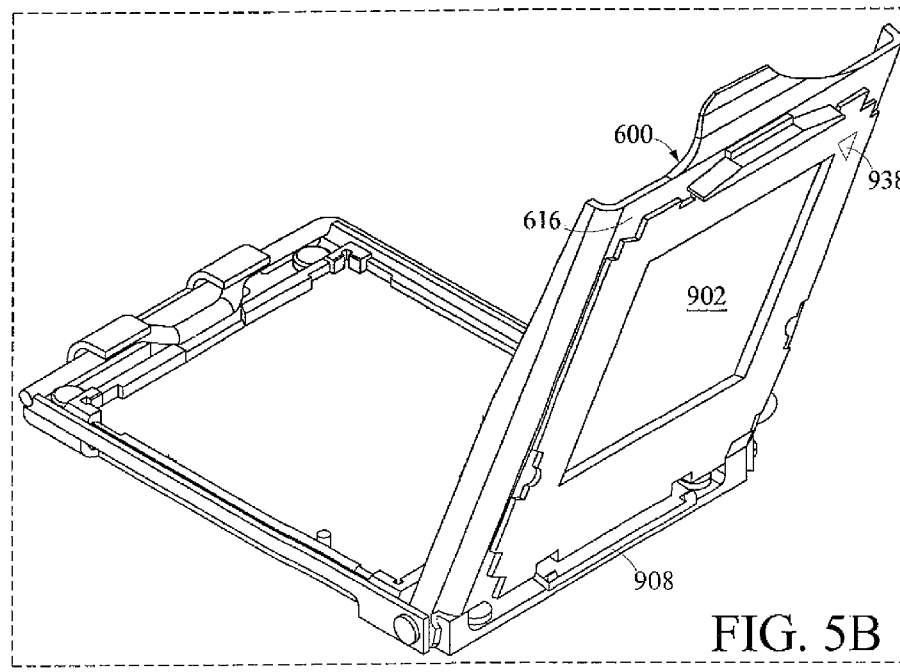
FIG. 5B
FIG. 5

SOCKET ASSEMBLY FOR SECURING SOCKET BODY

FIELD OF THE DISCLOSURE

The present disclosure relates to a socket assembly for electrically engaging an integrated circuit (IC) package with a printed circuit board (PCB), and more particularly, to the socket assembly including a pick-and-place (PnP) cap for securing a socket body.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

FIG. 5 illustrates a PnP cap in a second position, in accordance with an embodiment of the present disclosure;

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the present disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

The present disclosure provides a socket assembly capable of electrically engaging an Integrated Circuit (IC) package with a printed circuit board (PCB). The socket assembly includes a land-grid-array (LGA) socket body, a PnP cap and a loading mechanism. The socket body is surface-mounted on the PCB by BGA at the lower part of the socket. The PnP cap may be placed over the socket body for covering a first surface of the socket body in order to protect the LGA contacts/pins protruded from the first surface. The first surface of the socket body includes an opening for receiving the IC package. The IC package may be loaded by utilizing the loading mechanism. The loading mechanism includes an enabling frame, a loading plate, a lever and etc. The loading plate may be mounted over the socket body to load the IC package.

Figure 1:
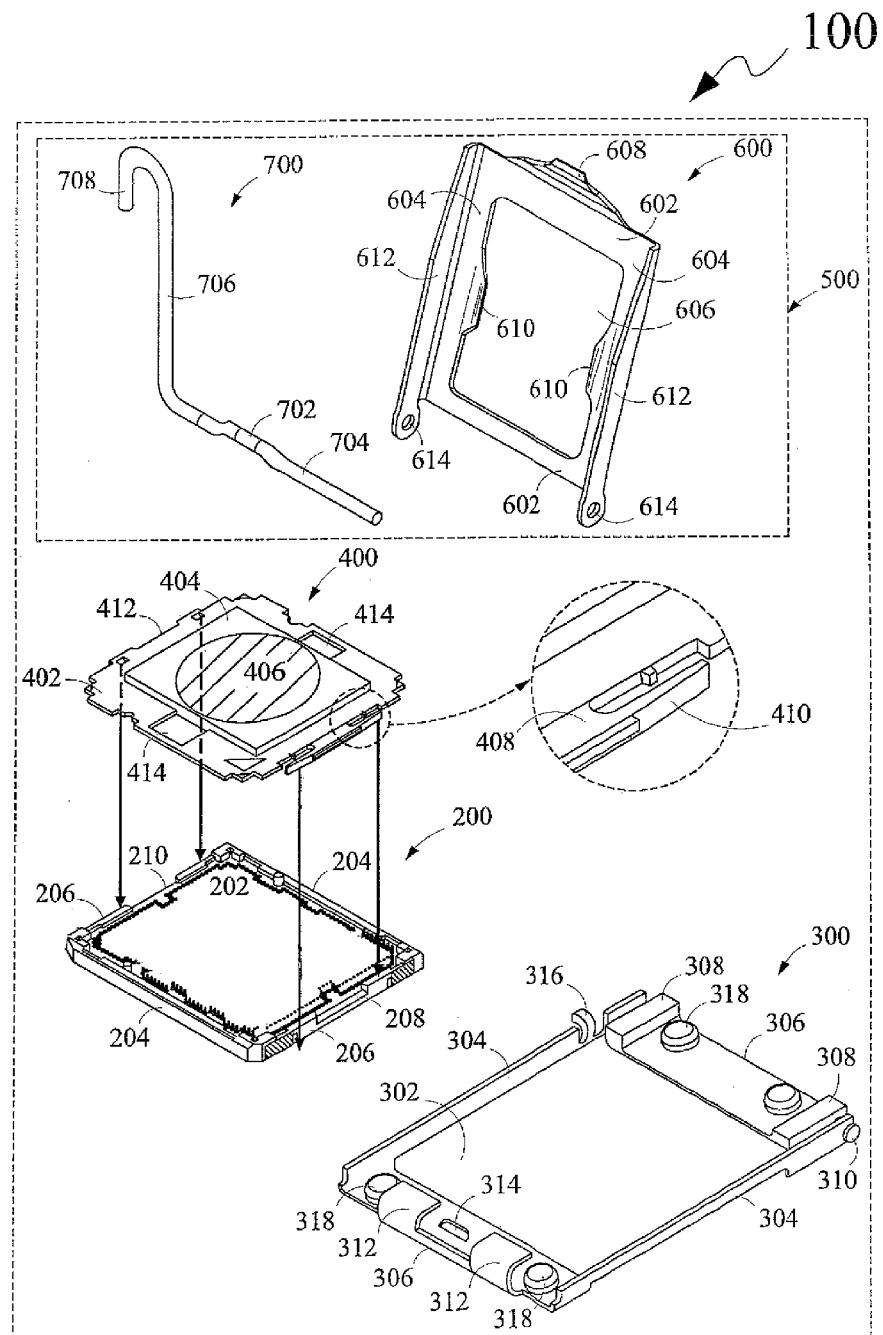
FIG. 1 is a perspective exploded component view of a socket assembly with a conventional pick-and-place (PnP) cap.

FIG. 1 is a perspective exploded component view of a socket assembly 100 with a conventional PnP cap. The components of the socket assembly 100 include a socket body 200, an enabling frame 300, a conventional pick-and-place (PnP) cap 400 and a loading mechanism 500. The conventional PnP cap 400 is hereinafter referred to as the PnP cap 400. The loading mechanism 500 includes a loading plate 600 and a lever 700. The enabling frame 300 includes a central opening 302 for receiving the socket body 200. The enabling frame 300 may be mounted above the PCB by screws 318 which may be connected to the structure below PCB. The socket body 200 received therewithin is surface-mounted on a PCB (not shown in FIG. 1). The PnP cap 400 may be removably attached to peripheral walls of the socket body 200 for covering a first surface 202 of the socket body 200. Accordingly, the PnP cap 400 protects the socket body 200 from being contaminated by external elements such as dust, human touch, and the like.

The peripheral walls of the socket body 200 includes two side walls 204 opposite and spaced apart and two end walls 206 connecting the two side walls 204 in a manner such that a first surface 202, the two side walls 204 and the two end walls 206 configure a receiving space therebetween. Such an arrangement of the socket body 200 configures a rectangular structure capable of accommodating the IC package (not shown in FIG. 1) therein. The socket body 200 may be surface-mounted on the PCB with the first surface 202 facing away from the PCB. The first surface 202 includes an array of contacts configured on the first surface 202 which enable electrical connection when in contact with contact pads on an underside of the IC package. The array of contacts may be of any suitable material such as gold-plated copper and the like. The array of contacts may be arranged in a fashion facilitating electrical connectivity with the contact pads of the IC Package. For example, the array of contacts may be arranged in a grid array fashion.

The first surface 202 of the socket body 200 may be covered by the PnP cap 400 to protect the array of contacts from contamination from external elements such as dust, human-touch, and the like. The PnP cap 400 is configured as a rectangular structure including a top surface 402 having a raised portion 404 and correspondingly a bottom surface (not shown) having a stepped cavity therein. The raised portion 404 configured by the stepped cavity at the bottom surface prevents a planar surface of the PnP cap 400 from coming in contact with the first surface 202 of the socket body 200 when placed thereupon. Further, the raised portion 404 may have a circular smooth area 406 defined in the center of the raised portion 404. The circular smooth area 406 serves to provide sufficient smooth area to receive suction force applied by a vacuum pump suction for picking up the PnP cap 400 (along with the socket body 200) during the surface mounting process. The PnP cap 400 further comprises a neck portion 408 extending from a peripheral edge of the PnP cap 400 supporting a protrusion 410.

Further, one of the end walls 206 of the socket body 200 defines a groove 208. The groove 208 may be configured to accommodate the neck portion 408 supporting the protrusion 410 extending from the PnP cap 400. The neck portion 408 supporting the protrusion 410 may be dimensioned in a manner such that the neck portion 408 fits the width of the groove 208, thereby latching the PnP cap 400 to the socket body 200. Further, the PnP cap 400 may have latches 412 on an edge of the top surface 402 such that the latches 412 may grip on to a groove 210 on a lower surface (not shown) of the socket body 200. It will be evident to those skilled in the art that peripheral edges of the PnP cap 400 may further include engagement features, such as a plurality of wedges and curved surface edges for coupling the PnP cap 400 to the socket body 200. The socket body 200 may have complimentary engagement features on peripheral edges of the side-walls 204 and the end-walls 206 for coupling the PnP cap 400 to the socket body 200.

Two openings 414 may be provided in the PnP cap 400 adjacent to the raised portion 404 and extending along the peripheral edges of the PnP cap 400. The openings 414 avoid interference between the tabs of the loading plate and the PnP cap, and can also serve as ventilation openings and may improve the air flow into the socket body 200 when the PnP cap 400 is coupled to the socket body 200.

As already mentioned, the socket body 200 is housed in the central opening 302 of the enabling frame 300. The socket body frame 300 includes two side walls 304 opposite and spaced apart and two end walls 306 connecting the two side walls 304 in a manner such that the two side walls 304 and the two end walls 306 configure the central opening 302 therebetween. Further, one of the end walls 306 (hereinafter referred to as a rear end wall 306) may have two curved portions 308 extending upwards on two ends of the rear end wall 306. There exists an opening between an end of the rear end wall 306 and the side walls 304. The rear end wall 306 is coupled to the side walls 304 at each end using short shafts 310. Another end wall 306 (hereinafter referred to as a front end wall 306) includes two protruding portions 312 extending above the socket body frame 300 and curving towards the central opening 302, thereby configuring a gap for accommodating rotation of the lever 700. The lever 700 may be disposed on the enabling frame 300. Further, a base of the front end wall 306 of the socket body frame 300 includes a groove 314 for accommodating a protruding edge of the lever 700. The enabling frame 300 includes a chip portion 316 configured on a side wall of the side walls 304 and extending away from the central opening 302. The protruding edge of the lever 700 and the chip portion 316 of the lever 700 will be explained in conjunction with the loading mechanism 500. The socket body frame 300 also includes screws 318 to engage with the structure below the PCB (not shown) through openings, such as a punctured opening 802 provided in a PCB 800.

Upon placing the PnP cap 400 covering the first surface 202 of the socket body 200, the loading mechanism 500 is mounted on the PnP cap 400. The loading plate 600 of the loading mechanism 500 may be pivotally connected to the front end-wall 306 of the socket body frame 300 and the lever 700 may be pivotally connected at the rear end-wall 306 of the socket body frame 300. The loading plate 600 may rotate between an open position for removing the PnP cap 400 and receiving the IC package, and, a closed position without the PnP cap for applying a downward force on the IC package or a closed position with the PnP cap flipped to protect the socket top surface 202 after the loading mechanism 500 assembled.

The loading plate 600 includes a first pair of arms 602 opposite and spaced apart and a second pair of arms 604 connecting the first pair of arms 602, thereby configuring a central opening 606 therebetween. A first arm of the first pair of arms 602 bears a locking portion 608 extending away from the first arm. A pair of pressing portions 610 is configured on the second pair of arms 604 in a manner such that the pair of pressing portions 610 extends into the central opening 606. Further, each arm of the second pair of arms 604 includes a wall 612 extending perpendicularly and along a length of the second pair of arms 604. Each wall 612 has a hole 614 at an end portion such that each hole 614 is received through the opening between an end of the rear end wall 306 and the side wall 304, and the loading plate 600 is pivotally hinged using the shafts 310. On removal of the PnP cap 400 and the insertion of the IC package, the pair of pressing portions 610 of the loading plate 600 is capable of applying a downward force on the IC package.

The locking portion 608 of the loading plate 600 is a curved surface which rests below a protruding edge 702 of a closing shaft 704 of the lever 700, thereby locking the loading plate 600 in the closed position. A driving shaft 706 of the lever 700 includes a u-shaped portion 708, which may be lifted from a horizontal position (closed position) to lift the protruding edge 702 of the closing shaft 704. Accordingly, the protruding edge 702 of the closing shaft 704 is lifted, thereby unlocking the locking portion 608 of the loading plate 600, which may then be rotated to assume an open position.

The lever 700 is capable of detachably engaging the loading plate 600 on the socket body 200 when the lever 700 is in a closed position. Further, the lever 700 is capable of disengaging the loading plate 600 from the socket body 200 when the lever 700 is in an open position.

Further, in the closed position of the loading plate 600, the loading plate 600 is mounted on the socket body 200 to load the IC package. To load the IC package, the PnP cap 400 is removed from the socket body 200, and the loading plate 600 is mounted around the socket body 200. This is explained further with respect to FIGS. 2A, 2B and 2C.

The socket assembly 100 is shown to include the conventional PnP cap 400 for the purpose of description only. However, it should be obvious to a person skilled in the art that the socket assembly 100 may include any other PnP cap, for example, a PnP cap 900 (explained in FIG. 4).

Figure 2A:
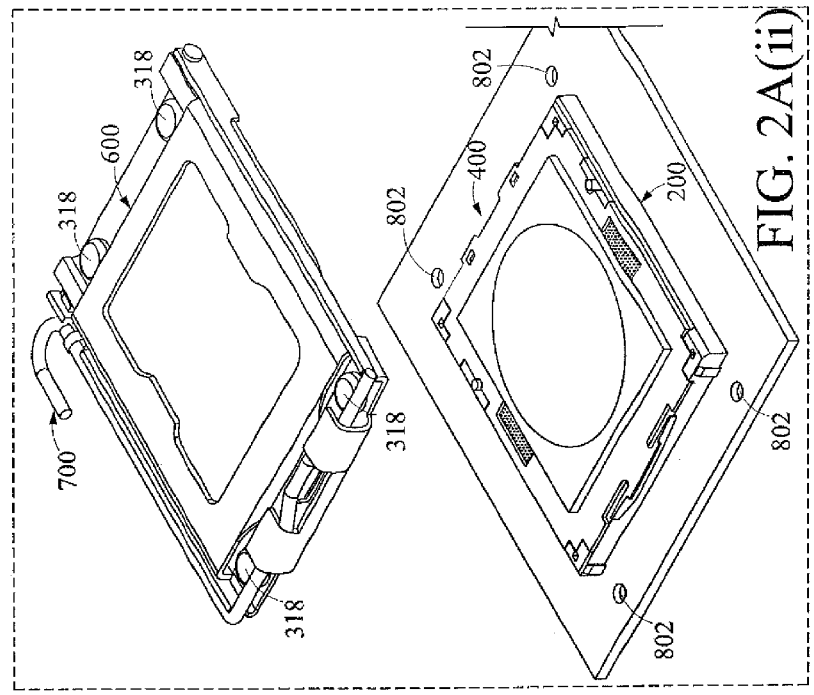
FIG. 2A illustrates an arrangement of a socket body with a conventional PnP cap and mounting of a loading mechanism on the arrangement.
Figure 2A:
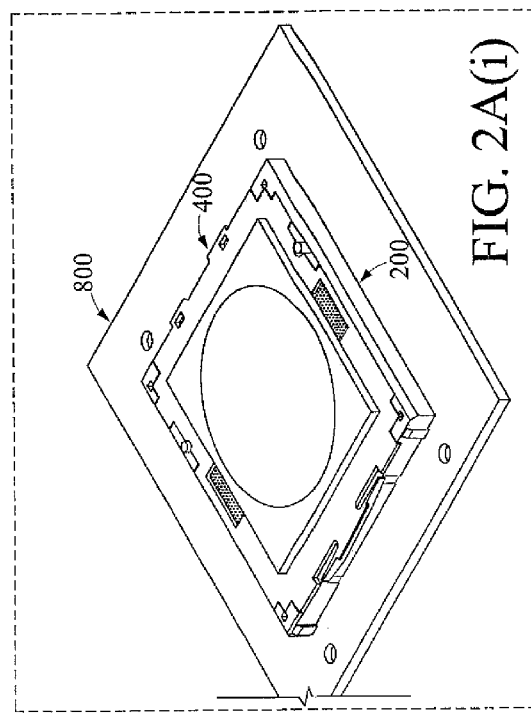

FIG. 2A illustrates an arrangement of the socket body 200 with the conventional PnP cap 400 and mounting of the loading mechanism 500 on the arrangement. FIG. 2A(i) illustrates an arrangement of the socket body 200 with the conventional PnP cap 400. Further, FIG. 2A(ii) illustrates the loading mechanism 500 mounted on the arrangement.

In the FIG. 2A(i), the socket body 200 is shown mounted on the PCB 800. Further, the socket body 200 is covered by the PnP cap 400 so as to protect the array of contacts, mounted on the socket body 200, from being contaminated.

The socket assembly 100 may be tested by placing an IC package on the socket body 200 and mounting the loading mechanism 500 on the surface-mounted socket body 200.

The FIG. 2A(ii) further illustrates the PnP cap 400 placed over the socket body 200 for covering the first surface 202 of the socket body 200. Further, the loading mechanism 500 is arranged to be mounted on the socket body 200. As explained in connection with FIG. 1, the loading mechanism 500 includes the loading plate 600 and the lever 700. The loading mechanism 500 including the loading plate 600 and the lever 700 is shown coupled to the enabling frame 300 for visualization purpose. The enabling frame 300 also includes screws 318 to engage with the structure below the PCB through openings, such as punctured opening 802 provided on the PCB 800.

Figure 2B:
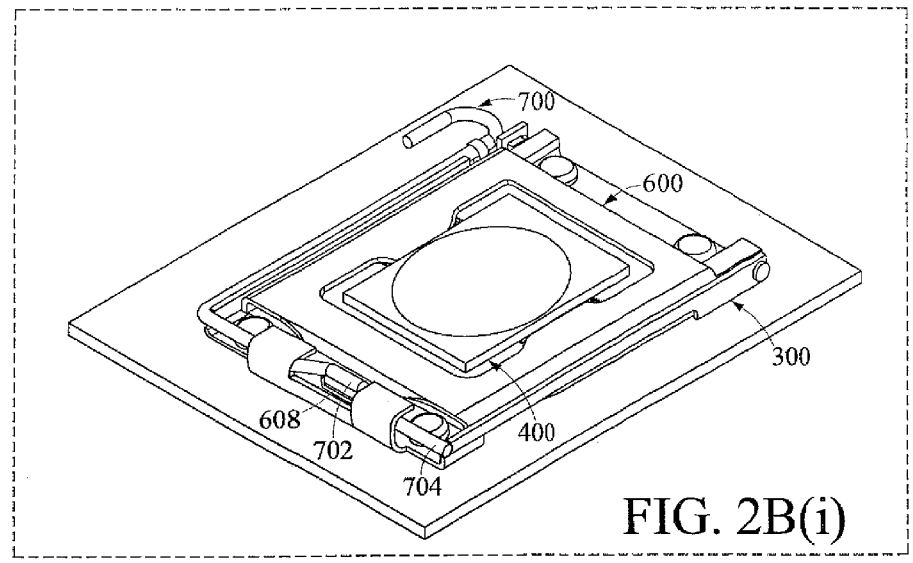
FIG. 2B illustrates an arrangement of a loading mechanism mounted on a socket body with a loading plate in a closed position and in an open position.
Figure 2B:
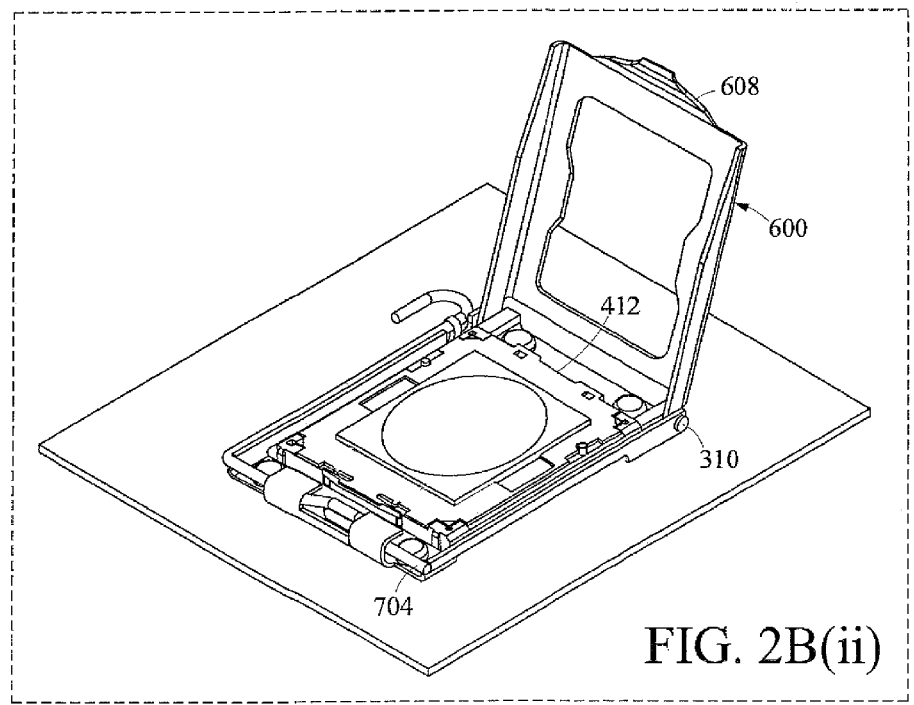

FIG. 2B illustrates an arrangement of the loading mechanism 500 mounted on the socket body 200 with the loading plate 600 in the closed position and in the open position.

FIG. 2B(i) illustrates the loading mechanism 500 mounted on the socket body 200 in the closed position. Further, the loading plate 600 is shown closed on the socket body frame 300 by engaging the locking portion 608 of the loading plate 600 below the protruding edge 702 of the closing shaft 704 of the lever 700, thereby locking the loading plate 600 in the closed position.

In order to perform a test on the socket body 200, the PnP cap 400 is removed from the first surface 202 of the socket body 200, so that the IC package can fit on the socket body 200. For removal of the PnP cap 400 from the socket body 200, the loading plate 600 is opened by disengaging the locking portion 608 of the loading plate from the protruding edge 702 of the lever 700, thereby configuring the loading plate 600 in the open position.

FIG. 2B(ii) illustrates an arrangement of the loading mechanism 500 mounted on the socket body 200 with the loading plate 600 in the open position. When the loading plate 600 is in the open position, the PnP cap 400 may be removed manually from the first surface 202 of the socket body 200 by disengaging the latch 412 from the socket body 200. However, while attempting to remove the PnP cap 400, the latch 412 may break, thereby contaminating the socket body 200 with the debris of the broken latch 412.

Figure 2C:
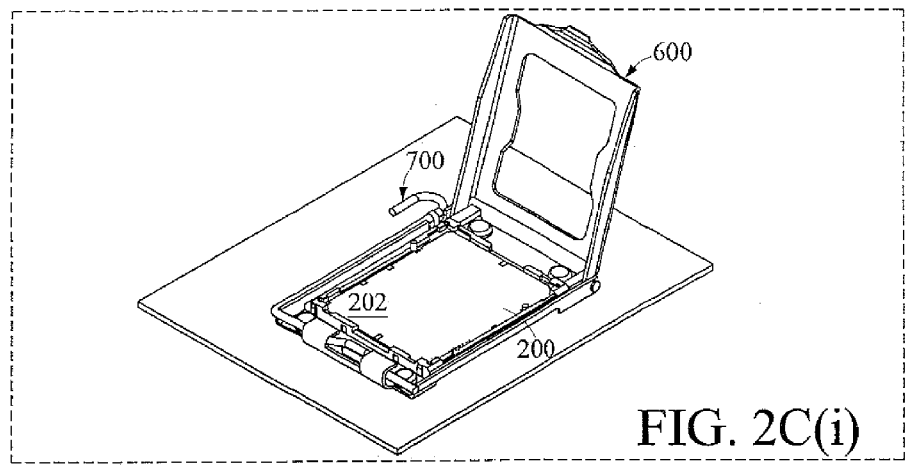
FIG. 2C illustrates an arrangement of an Integrated Circuit (IC) package in a receiving space of a socket body.
Figure 2C:
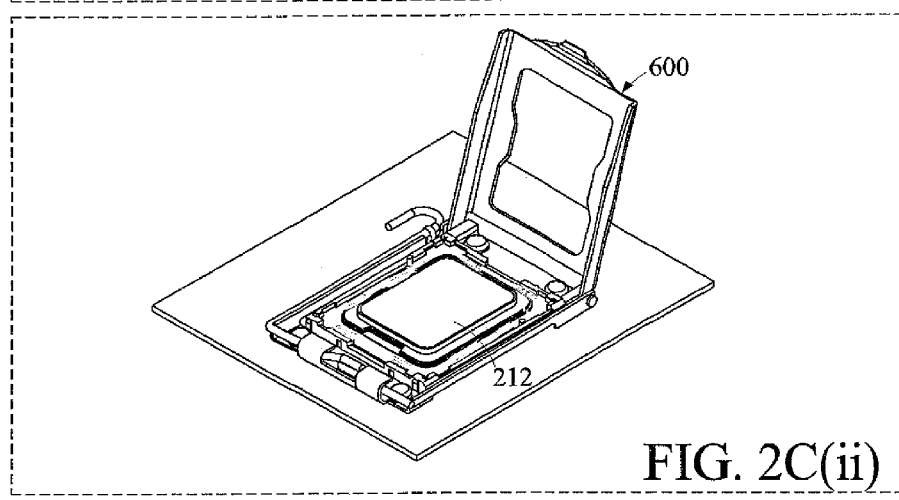
Figure 2C:
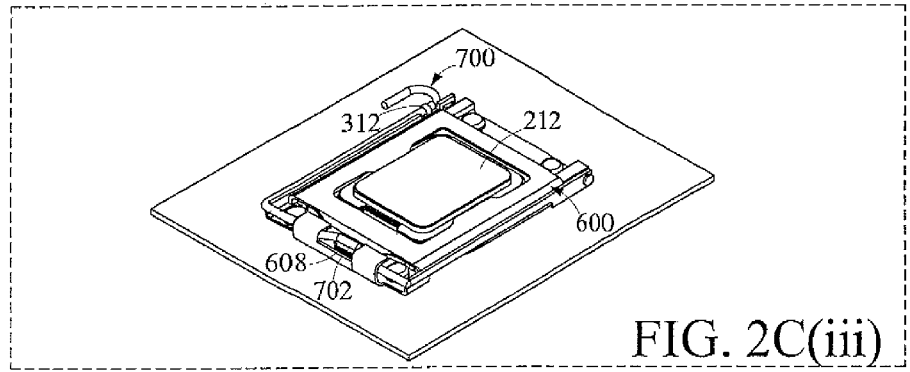

FIG. 2C illustrates an arrangement depicting the receiving space of the socket body 200 for receiving the IC package 212 and an arrangement depicting the IC package 212 mounted on the socket body 200.

FIG. 2C(i) illustrates an arrangement depicting the receiving space of the socket body 200 for receiving the IC package 212, when the loading plate 600 is shown in the open position. The open position of the loading plate 600 is achieved by lifting the driving shaft 706 of the lever 700 (to unlock the locking portion 608 of the loading plate 600) and raising the loading plate 600. Thereafter, an IC package 212 is placed over the socket body (not shown), as illustrated in FIG. 2C(ii). The IC package 212 is loaded using the loading mechanism 500.

FIG. 2C(iii) illustrates an arrangement of the IC package in the socket body 200 with loading plate 600 closed on the IC package. The IC package 212 may be loaded by closing the loading plate 600 on the socket body (not shown) and engaging the locking portion 608 of the loading plate 600 with the protrusion portion 702 of the lever 700. Thereafter, the loaded socket body 200 may be tested. After performing the test on the socket body 200, the loading plate 600 is opened and the IC package 212 is removed from the top of the socket body 200 and a separate PnP cap is placed on the socket body 200 to securely cover the socket body.

Figure 3:
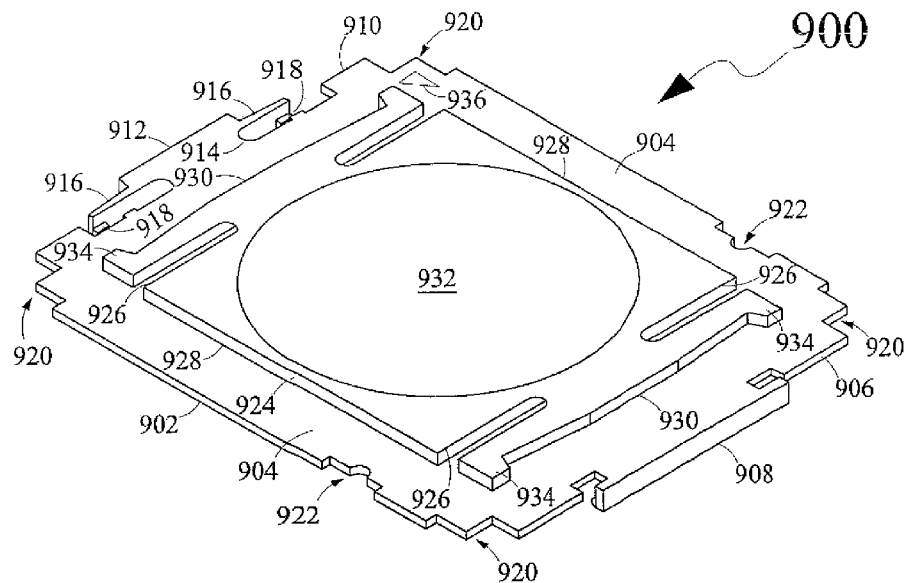
FIG. 3 illustrates a PnP cap for securing a socket body, according to an exemplary embodiment of the present disclosure.

FIG. 3 illustrates the PnP cap 900 for securing the socket body 200, according to an exemplary embodiment of the present disclosure. The PnP cap 900 includes a lower surface 902 and an upper surface 904, such that the upper surface 904 is opposite to the lower surface 902. The lower surface 902 of the PnP cap 900 may include a rectangular area defined by four edges. Further, the PnP cap 900 may include a plurality of peripheral edges and a first plurality of latches configured on the plurality of peripheral edges.

In one embodiment, the lateral edges of the PnP cap include a latch. The latch may be configured to mount the PnP cap 900 on the socket body 200. For example, the PnP cap 900 may include a lateral latch 908 configured on the lateral edge 906. The lateral latch 908 may be a rectangular clutch portion for gripping the grove 212 on one of the end-walls 206 in the socket body 200. Further, another lateral edge 910 of the PnP cap 900 may include an extended protrusion 912. The extended protrusion 912 may further include a narrow neck 914 with two arms 916 configured on the neck 914 such that the two arms 916 extend on opposite sides of the neck 914. A pair of hooks 918 may be configured on a lower side of each arm 916 of the extended protrusion 912 such that when the PnP cap 900 is pressed on the socket body 200, the neck 914 of the extended protrusion 912 may fit in the groove 208 on one of the end-walls 206 of the socket body 200 and the pair of hooks 918 may latch on to the openings (not shown) on the socket body 200, thereby latching the PnP cap 900 to the socket body 200.

The plurality of latches, for example, the latch 908 on the plurality of peripheral edges (such as the peripheral edge 906) is capable of engaging the PnP cap 900 with the socket body 200 when the PnP cap 900 is in a first position. The first position of the PnP cap 900 includes placing the PnP cap 900 on the socket body 200 for the purpose of protecting the socket body 200 from getting contaminated by dust, debris, and the like. This will be explained in more detail in the FIG. 4.

The rectangular portion configured by the upper surface 904, the lower portion 902 and the plurality of peripheral edges of the PnP cap 900 includes four corners. Each of the four corners includes engagement features such as a stepped portion 920 to be received into the corresponding engagement features configured on the socket body 200. Each longitudinal side of the rectangular portion of the PnP cap 900 may also include a circular groove 922 configured to accommodate a pair of protruded limbs (not shown) of the socket body 200.

The upper surface 904 of the PnP cap 900 includes a raised portion 924. In one embodiment, the upper surface 904 of the PnP cap 900 may be configured as a rectangular structure having the raised portion 924 and correspondingly a bottom surface (not shown) having a stepped cavity therein. The raised portion 924 configured by the stepped cavity at the bottom surface prevents the lower surface 902 of the PnP cap 900 from coming in contact with the first surface 202 of the socket body 200 when placed thereupon.

The rectangular structure of the raised portion 924 may include four edges extending parallel to the edges of the lower surface 902 of the PnP cap 900. The edges of the raised portion 924 may include a pair of lateral edges 926 and a pair of longitudinal edges 928. Each edge of the pair of lateral edges 926 may include the second plurality of latches, such as a T-shaped extended portion 930 protruding out of the respective lateral edge 926 of the raised portion 924.

The second plurality of latches is capable of detachably engaging the PnP cap 900 with the central opening 606 of the loading plate 600 when the PnP cap 900 is in a second position. The second position of the PnP cap 900 includes engaging the raised portion 924 of the PnP cap 900 on an outer surface of the loading plate 600, as shown in FIGS. 5A and 5B.

In one embodiment, a top face 932 (shown by a circled area in the FIG. 3) of the raised portion 924 may be sufficiently smooth for a suction pickup of the socket assembly 100. The suction pickup of the socket assembly 100 may be provided by a pick and place machine (not shown). In one embodiment, the PnP cap 900 may be molded using Liquid-Crystal-Polymer (LCP) and such other materials.

Additionally, a height of the raised portion 924 may be based on a clearance between the top face 932 on the raised portion 924 of the PnP cap 900 and the first surface 202 of the socket body 200 when the PnP cap 900 is mounted at the outer surface of the loading plate 600 as shown in FIG. 5.

Figure 4:
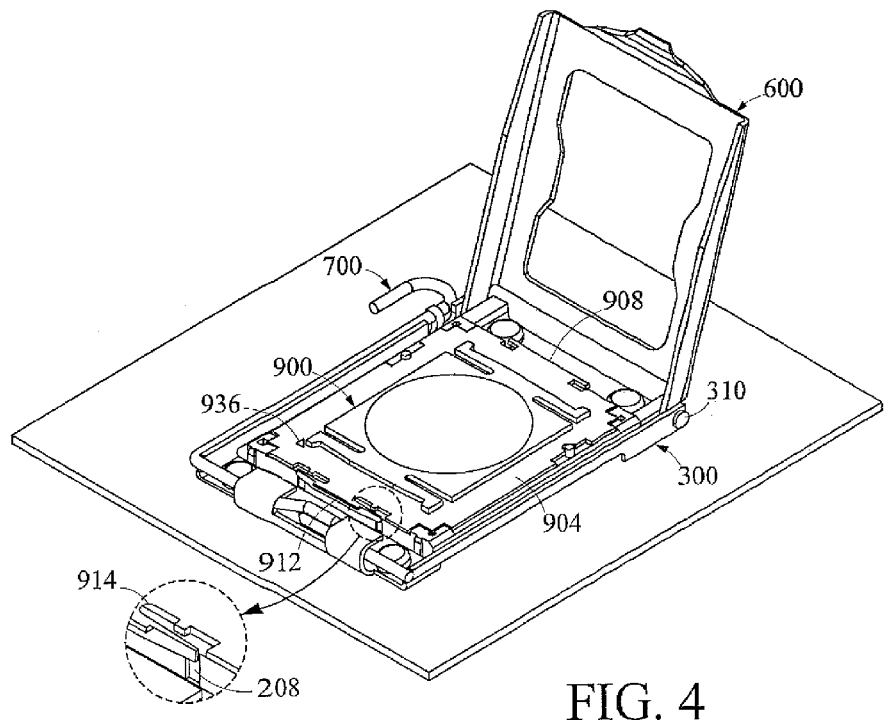
FIG. 4 illustrates a PnP cap in a first position, in accordance with an embodiment of the present disclosure.

FIG. 4 illustrates the PnP cap 900 in the first position, in accordance with an embodiment of the present disclosure. In the first position, the PnP cap 900 may be latched onto the socket body 200. The lower surface 902 of the PnP cap 900 may be placed on the socket body 200 such that the peripheral edges 906 and 910 extend parallel to the edges of the socket body 200. When the PnP cap 900 is pressed on the socket body 200, the neck 914 of the extended protrusion 912 may fit in the groove 208 on the front end wall 206 of the socket body 200. Further, the pair of hooks 918 (as shown in the FIG. 3) configured on the lower side of each arm of the extended protrusion 912 may fit in the groove 208 on the socket body 200. The rectangular clutch portion 908 on the opposite edge of the lower side of the PnP cap 900 may engage with the grove 210 in the socket body 200, thereby latching the PnP cap 900 to the socket body 200 in the first position.

The loading mechanism 500 including the loading plate 600 and the lever 700 is shown coupled to the enabling frame 300 for visualization purpose. The loading plate 600 is shown engaged with the enabling frame 300 by shaft 310. However, it will be obvious to a person skilled in the art that the loading plate 600 may be coupled to the socket body frame 300 by any other coupling means, without departing from the teachings of the present disclosure.

Further, the enabling frame 300 includes screws, such as the screws 318, to engage with the structure below PCB (not shown) through openings, such as punctured opening 802 provided in the PCB 800. The loading plate 600 and the lever 700 are illustrated in the open position in an assembled version of the socket assembly 100 on the PCB 800.

FIG. 5 illustrates the PnP cap 100 in a second position, in accordance with an embodiment of the present disclosure FIG. 5A illustrates the PnP cap 900 in the second position showing the raised portion 924 of the PnP cap 900. FIG. 5B illustrates the PnP cap 900 in the second position, showing the lower surface 902 of the PnP cap 900. In the second position, the PnP cap 900 engages the raised portion 924 (not shown) with an outer surface 616 of the loading plate 600 by fixing the plurality of latches, such as the T-shaped extended portion 930, on the raised portion of the PnP cap 900 with the central opening 606 of the loading plate 600. With such an arrangement, the raised portion 924 of the PnP cap 900 may be pressed towards the outer surface 616 and against the central opening 606 of the loading plate 600. Accordingly, protruded hooks 934 on the end of the T-shaped extended portion 930 of the raised portion 924 of the PnP cap 900 may engage with lateral sides of the central opening 606 of the loading plate 600. Further, as illustrated in the FIG. 5B, the latch 908 on the peripheral edge 906 of the PnP cap 900 may grip a lower arm of the pair of arms of the loading plate 600. In one embodiment, the longitudinal sides of the raised portion 924 of the PnP cap 900 may engage with the pair of pressing portions 610 of the loading plate 600.

Furthermore, in an embodiment of the disclosure, at least one of the upper surface 904 and the lower surface 902 of the PnP cap 900 includes a mark. The mark is configured to guide the correct mounting of the PnP cap 900 in at least one of the first position and the second position. For example, the upper surface 904 is shown to include a mark 936 in FIG. 3. An inner portion of the lower surface 902 is shown to include a mark 938 in the FIG. 5B.

Figure 6A:
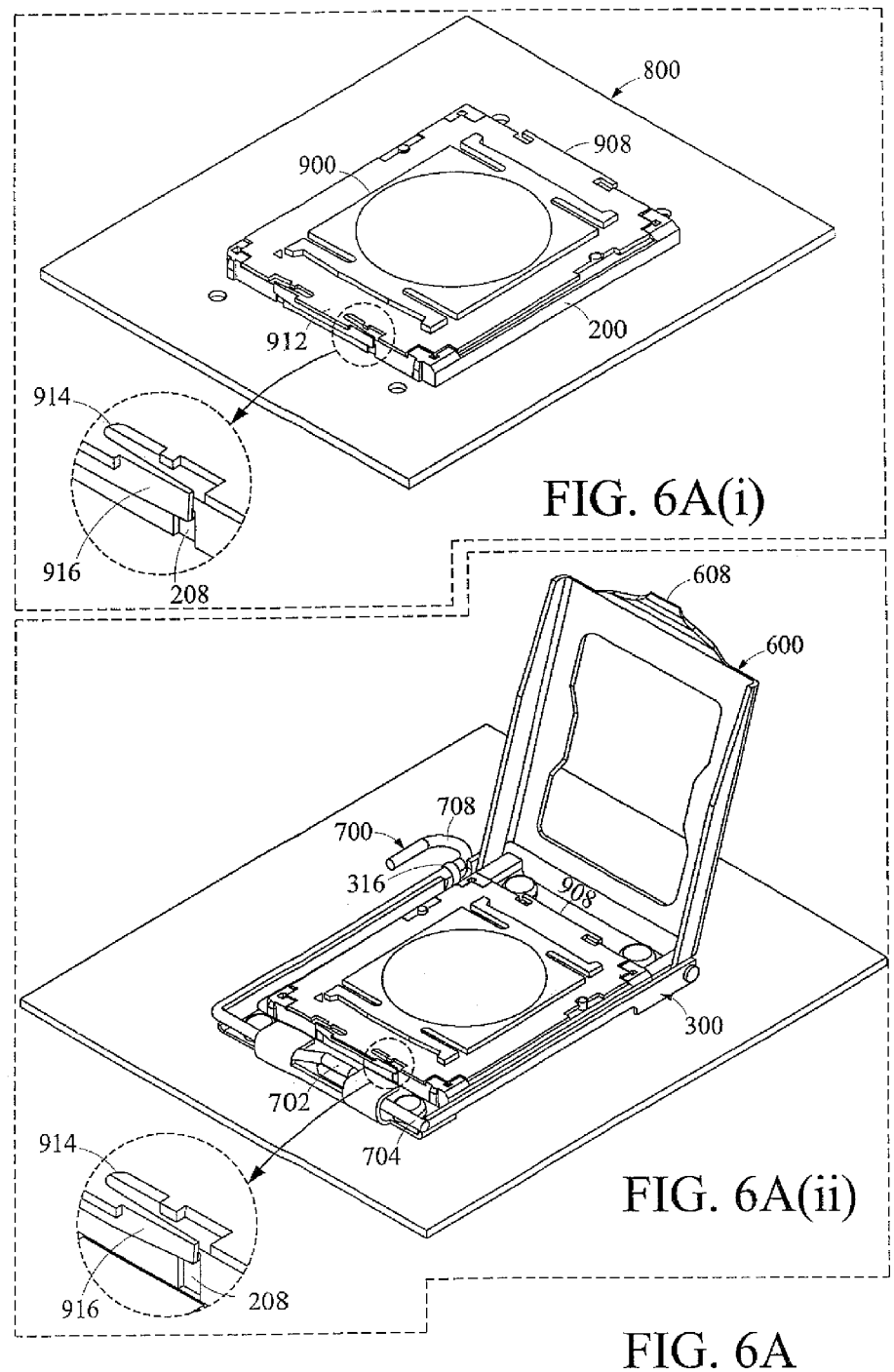
FIG. 6A illustrates an arrangement of a socket body with a PnP cap and mounting of a loading mechanism on the arrangement, in accordance with an embodiment of the present disclosure.

FIG. 6A illustrates an arrangement of the socket body 200 with the PnP cap 900 and mounting of the loading mechanism 500 on the arrangement, in accordance with an embodiment of the present disclosure.

FIG. 6A(i) shows the PnP cap 900 mounted on the socket body 200 with loading plate 600 closed on the socket body 200. This is one possible arrangement of the socket body and the PnP cap 900 when the socket body 200 is manufactured. This may be done to prevent the socket body 200 (including the array of contact on the socket body) from being contaminated from dust, human touch and the like. The socket body 200 with the PnP cap 900 is shown mounted on the surface of the PCB 800.

As already explained with respect to FIG. 4, when the PnP cap 900 is pressed on the socket body 200, the plurality of latches on the peripheral edges of the PnP cap 900 engages with the corresponding openings in the socket body 200, thereby fixing the PnP cap 900 on the socket body 200. For example, the latch 908 on the peripheral edge 906 of the PnP cap 900 may engage with the grooves (not shown) on the end-wall (not shown) of the socket body 200. Further, the extended protrusion 912 having the neck 914 and two arms 916 attached to the neck 914 may engage with the groove 208 on the socket body 200. The pair of hooks (not shown) planted on the lower side of each arm 916 of the extended protrusion 912 may enable the neck 914 of the extended protrusion 912 to fit in the groove 208 on the socket body 200, thereby latching the PnP cap 900 to the socket body 200.

When the socket assembly 100 is manufactured, the socket body 200 may be tested by placing an IC package on the socket body 200. Accordingly, the PnP cap 900 covering the socket body 200 has to be removed from the socket body 200 by opening the loading plate 600.

FIG. 6A(ii) illustrates the socket body 100 with the loading plate 600 in the open position. The loading plate 600 is shown removed from the first surface 202 of the socket body 200. The u-shaped portion 708 of the lever 700 may be disengaged from the chip portion 316, thereby disengaging the locking portion 608 of the loading plate 600 from the protruding edge 702 of the lever 700.

Further, the PnP cap 900 may be removed from the socket body 200 by disengaging the first plurality of latches on the PnP cap 900 from the socket body 200. For example, the latch 908 may be disengaged from the socket body 200. The neck 914 of the PnP cap 900 may be disengaged from the groove 208 on one of the end-walls 206 of the socket body 200. In one embodiment of the disclosure, the PnP cap 900 may be removed from the socket body 200 when it is desired to perform a test on the socket body 200. The test may be performed by removing the PnP cap 900 and placing an IC package 212 on the first face of the socket body 200 such that the array of contacts (not shown) on the socket body 200 comes in contact with the contact pads on the IC package.

Figure 6B:
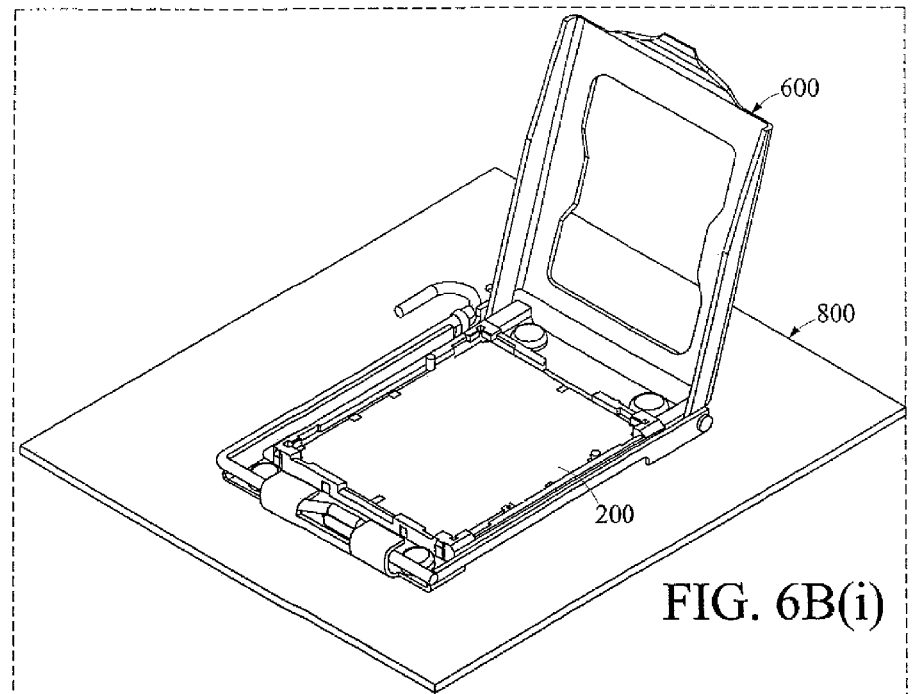
FIG. 6B illustrates an arrangement of a loading mechanism mounted on a socket body with a loading plate in an open position and in a closed position, in accordance with an embodiment of the present disclosure.
Figure 6B:
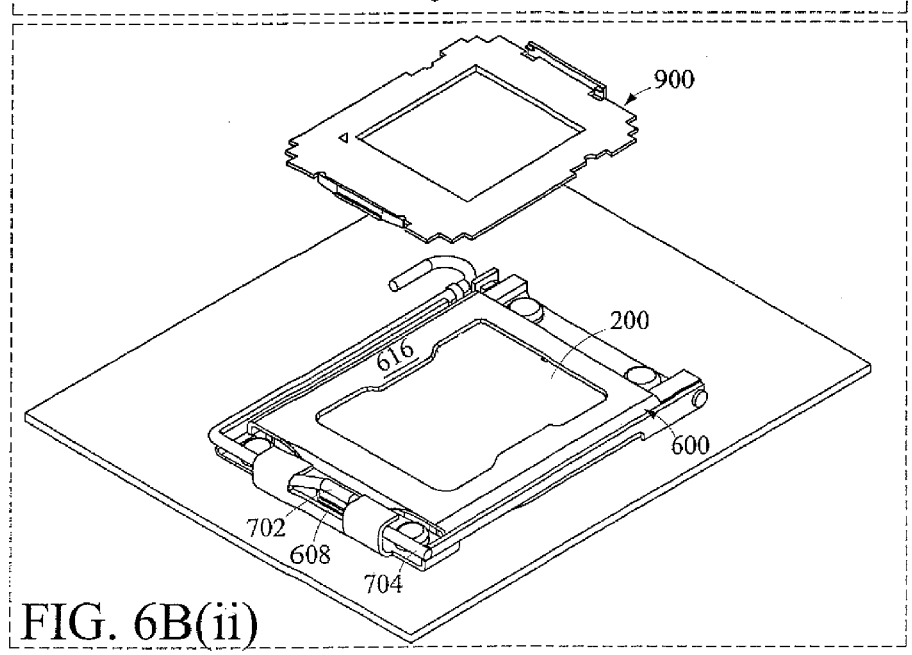

FIG. 6B illustrates an arrangement of the loading mechanism 500 mounted on the socket body 200 with the loading plate 600, in accordance with an embodiment of the present disclosure. FIG. 6B(i) illustrates an arrangement of the socket body frame 300 with the loading plate 600 in the open position. This arrangement may be achieved when the PnP cap 900 is removed from the socket body 200.

FIG. 6B(ii) illustrates an arrangement of the socket body frame 300 with the loading plate 600 closed on the socket body 200. The loading plate 600 may be closed on the socket body 200 by engaging the locking portion 608 of the loading plate 600 with the protruding edge 702 of the closing shaft 704 of the lever 700. Further, the disengaged PnP cap 900 may be rotated from the first position such that the raised portion (not shown) on the upper portion 904 of the PnP cap 900 may face an outer surface 616 of the loading plate 600. The rotated PnP cap 900 may be placed and pressed on the outer surface 616 of the loading plate 600.

Figure 6C:
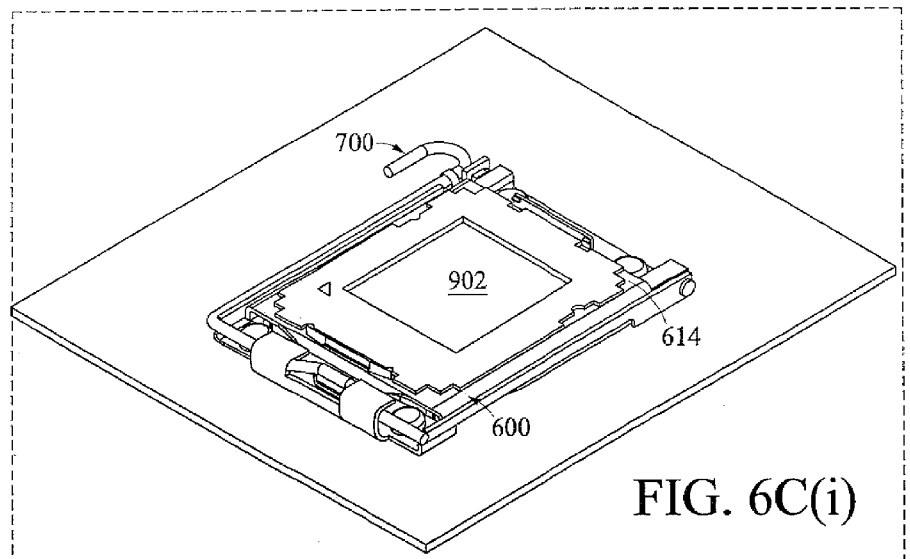
FIG. 6C illustrates an arrangement of a socket assembly with a PnP cap mounted on a loading plate, in accordance with an embodiment of the present disclosure.
Figure 6C:
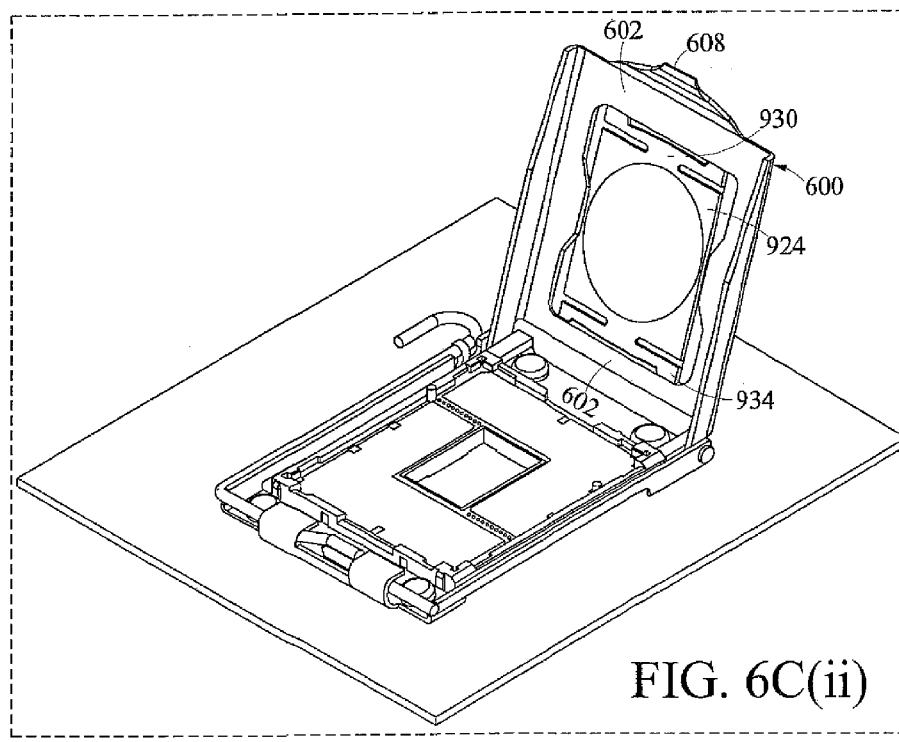

FIG. 6C illustrates an arrangement of the socket assembly 100 with the PnP cap 900 mounted on the loading plate 600, in accordance with an embodiment of the present disclosure.

FIG. 6C(i) illustrates an arrangement of the socket assembly 100 with the PnP cap 900 mounted on the outer surface 616 of the loading plate 600. As shown further in FIG. 6C(ii), the T-shaped extended portion 930 on the lateral edges of the raised portion 924 of the PnP cap 900 may engage with the central opening 606 of the loading plate 600. In an embodiment, the configuration of the socket assembly 100, as mentioned in the FIG. 6C(i) may be utilized when the test is performed on the socket body 200. In other words, after performing the test it may be desired to close the loading plate 600 and secure the socket body 200. The socket body may be secured by covering the loading plate 600 with the PnP cap 900 so that the second position of the PnP cap 900 may be realized. In one embodiment, the PnP cap 900 may be flipped from the first position for being in the second position.

FIG. 6C(ii) illustrates an arrangement of the socket assembly 100 with the loading plate 600 in the open position and the PnP cap 900 mounted in the central opening 606 of the loading plate 600. More specifically, the protruded hooks 934 on the T-shaped extended portion 930 are shown latched with the first pair of arms 602 of the loading plate 600. In one embodiment, when it is desired to perform a test on the socket body 200, the PnP cap 900 may be pushed out of the central opening 606 of the loading plate 900 by applying a force on the raised portion 924 of the PnP cap 900.

Figure 6D:
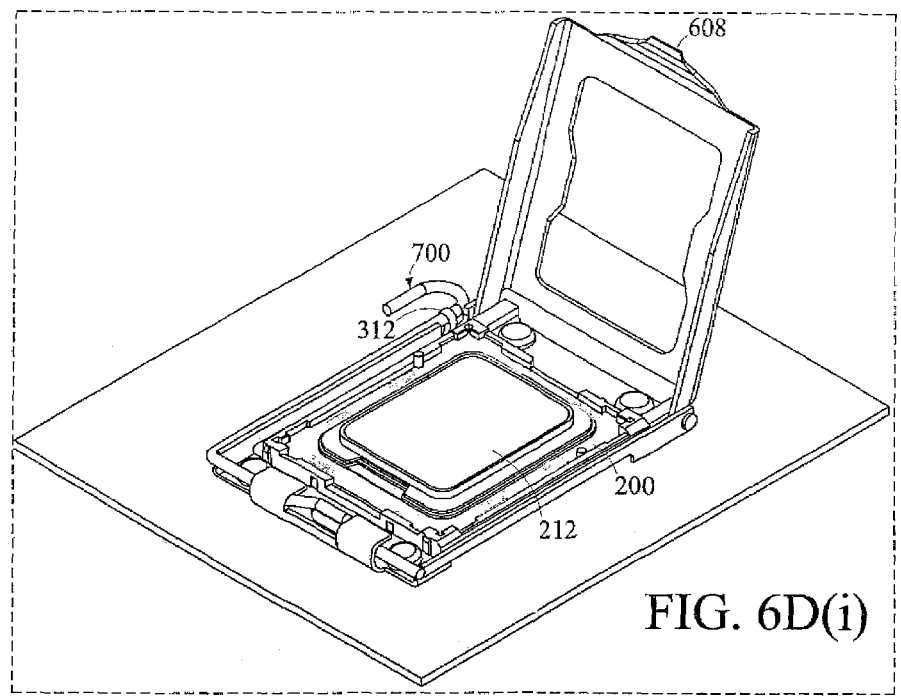
FIG. 6D illustrates an arrangement of an IC package in a receiving space of a socket body, in accordance with an embodiment of the present disclosure.
Figure 6D:
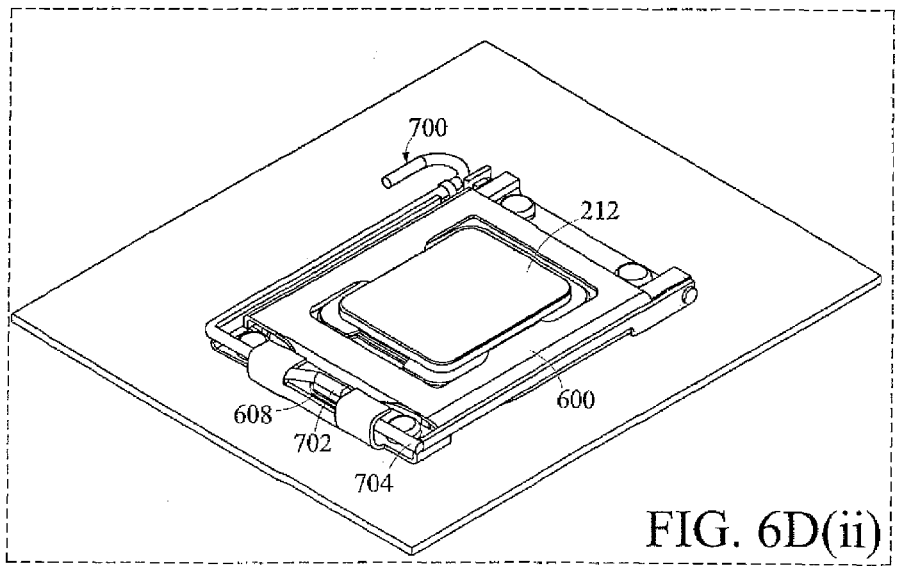

FIG. 6D illustrates an arrangement of an IC package in a receiving space of a socket body, in accordance with an embodiment of the present disclosure FIG. 6D(i) illustrates an arrangement of the IC package 212 in the receiving space of the socket body 200 when the loading plate is in the open position. When the IC package 212 is placed on the socket body 200, the contact pads underneath the IC package 212 touch the array of contacts on the top face (not shown) of the socket body 200, thereby enabling an electrical connection between the IC package 212 and the socket body 200. In one embodiment, the arrangement of the socket assembly as illustrated in the FIG. 6D(i) may be utilized when it is desired to perform the test on the socket body 200.

FIG. 6D(ii) illustrates an arrangement of the socket body 200 with the IC package 212 mounted on the socket body (not shown), when the loading plate 600 is in the closed position. The IC package 212 may be loaded by applying the loading mechanism 500 on the IC package 212 such that the locking portion 608 of the loading plate 600 may be engaged with the protruding edge 702 of the shaft 704 of the lever 700. The loading plate 600 applies a force on the IC package 212 sufficient enough to electrically connect the contact pads on the IC package 212 with the array of contacts on the socket body 200. In one embodiment, the arrangement of the socket assembly 100, as illustrated in the FIG. 6D(ii) may be utilized while performing the test on the socket body 200.

After performing the test on the socket body 200, the IC package 212 may be removed from the socket body 200. Further, the PnP cap 900 may again be placed on the outer surface 616 of the loading plate 600, as illustrated in the FIG. 6C(i).

The present disclosure provides a socket assembly including a PnP cap. The PnP cap may be utilized for protecting the socket body. The PnP cap may be mounted either on the socket body or on the loading plate. Accordingly, the present disclosure provides a single PnP cap with a dual functionality to be used for both pick-n-place during surface mounting of the socket body as well as during testing of the socket body after installing the loading mechanism. Further, the PnP cap avoids the risk of damaging the latches of the PnP cap. This reduces the chances of contamination of the array of contact pads on the socket body by the debris of the broken latches. Moreover, the PnP cap disclosed in the present disclosure avoids any holes configured on the upper surface of the PnP cap. This ensures a larger coverage of the array of contacts on the socket body, thereby reducing contamination of the socket body. The central raised portion of the PnP cap also helps in venting hot air during reflow. Moreover, the PnP cap proves to be economically cheaper than the conventional PnP cap, since a single cap can be used for dual purpose.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A socket assembly for electrically engaging an integrated circuit (IC) package with a printed circuit board (PCB), the socket assembly comprising:
   a socket body surface-mounted on the PCB, the socket body capable of engaging the IC package with the PCB;
   a loading mechanism comprising a loading plate having a central opening, the loading plate capable of being mounted on the socket body when the loading plate is in a closed position; and
   a pick-and-place (PnP) cap comprising an upper surface and a lower surface, the PnP cap capable of being detachably mounted on the socket body in a first position, the PnP cap comprising:
      a first plurality of latches configured on a plurality of peripheral edges of the PnP cap, wherein the first plurality of latches is capable of engaging the PnP cap with the socket body when the PnP cap is in the first position, and
      a raised portion configured on the upper surface of the PnP cap, the raised portion comprising a second plurality of latches capable of detachably engaging the PnP cap with the central opening of the loading plate when the PnP cap is in a second position.

2. The socket assembly of claim 1, wherein the PnP cap is molded with a polymer material.

3. The socket assembly of claim 1, wherein the PnP cap further comprises a mark on at least one of the upper surface and the lower surface, and wherein the mark is configured to guide the mounting of the PnP cap in at least one of the first position and the second position.

4. The socket assembly of claim 1, wherein a height of the raised portion is based on a clearance between the upper surface of the PnP cap and the socket body when the PnP cap in the second position is closed on the socket body.

5. The socket assembly of claim 1, wherein each latch of the second plurality of latches project out of a lateral edge of the raised portion of the PnP cap.

6. The socket assembly of claim 1 further comprising an enabling frame capable of receiving the socket body for surface mounting the socket body on the PCB.

7. The socket assembly of claim 6, wherein the loading mechanism further comprises a lever disposed on the enabling frame for detachably engaging the loading plate on the socket body when the lever is in a closed position, and disengaging the loading plate from the socket body when the lever is in an open position.

8. The socket assembly of claim 1, wherein the second position of the PnP cap is realized by flipping the cap from the first position.

9. The socket assembly of claim 1, wherein a latch of the first plurality of latches is configured on a lateral edge of the plurality of peripheral edges.

10. The socket assembly of claim 9, wherein the latch of the first plurality of latches comprises a rectangular clutch portion for engaging with the socket body.

11. The socket assembly of claim 1, wherein the raised portion comprises a stepped cavity for preventing the lower surface of the PnP cap from coming in contact with the socket body when the PnP cap is in the first position.

* * * * *